United States Patent
Ohtomo

(10) Patent No.: US 6,222,614 B1
(45) Date of Patent: *Apr. 24, 2001

(54) EXPOSURE ELEMENTS WITH A CABLE-RELAYING SUPPORT

(75) Inventor: Toshiya Ohtomo, Tokyo (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/986,102

(22) Filed: Dec. 5, 1997

(30) Foreign Application Priority Data

Dec. 6, 1996 (JP) .................................................. 8-326248

(51) Int. Cl.[7] .................................................. G03B 27/42
(52) U.S. Cl. .............................. 355/53; 355/72; 355/75; 74/490.9
(58) Field of Search .................................. 355/53, 72, 75; 250/492.2; 356/399, 400, 401; 108/20; 318/567, 575; 74/490.09, 490.13; 901/16

(56) References Cited

U.S. PATENT DOCUMENTS

| 4,535,278 | 8/1985 | Asakawa | 318/687 |
|---|---|---|---|
| 4,780,617 | 10/1988 | Umatate et al. | 250/548 |
| 5,151,750 | 9/1992 | Magome et al. | 356/401 |
| 5,187,519 | * 2/1993 | Takabayashi et al. | 355/53 |
| 5,467,720 | * 11/1995 | Korenaga et al. | 108/20 |
| 5,523,574 | * 6/1996 | Shirasu | 355/53 |
| 5,623,853 | * 4/1997 | Novak et al. | 74/490.09 |

FOREIGN PATENT DOCUMENTS

2290658 * 1/1996 (GB) .

* cited by examiner

Primary Examiner—Alan A. Mathews
(74) Attorney, Agent, or Firm—Foley & Lardner

(57) ABSTRACT

In an exposure apparatus for projecting a mask pattern of a mask onto a photosensitive substrate, provided are a substrate stage which is two-dimensionally movable along an upper surface of a substrate base while carrying the photosensitive substrate thereon; substrate stage cable-relaying means which is disposed so as to be physically separated from the substrate base surface, secures thereto a cable connected to the substrate stage, and is movable in the same two-dimensional directions as those of the substrate stage; and substrate stage driving means to control an amount of movement of the substrate stage cable-relaying means such that relative positions of the substrate stage and cable-relaying means with respect to each other are always kept constant. Further, a reticle stage is similarly provided with reticle stage cable-relaying means which two-dimensionally moves so as to follow the reticle stage.

30 Claims, 7 Drawing Sheets

EXPOSURE ELEMENTS WITH A CABLE-RELAYING SUPPORT

BACKGROUND OF THE INVENTION

1. Field of the Invention

The present invention relates to an exposure apparatus for making semiconductor devices and liquid crystal display devices and, in particular, to an XY stage section of such an exposure apparatus.

2. Related Background Art

In order to make semiconductor devices and liquid crystal display devices, there has been employed an exposure apparatus for exposing a photosensitive substrate such as semiconductor wafer or glass plate to a pattern of a reticle or mask (hereinafter referred to as mask). As a means for moving the photosensitive substrate to a predetermined exposure position, the exposure apparatus includes a stage unit equipped with a substrate stage which is movable in two-dimensional directions of X and Y.

FIG. 9 is a conceptual view of a conventional stage unit. A substrate stage 71 having a substrate-mounting surface on its upper side is freely moved, by means of a driving section, over a base 72 along non-depicted guides for XY directions. A photosensitive substrate is mounted on the substrate-mounting surface of the substrate stage 71, and is attached thereto and held thereby as being vacuumed through a vacuum hole (not depicted) formed in the substrate-mounting surface. For such a kind of stage moving mechanism, the technique disclosed in U.S. Pat. No. 4,535,278 can be used.

Connected to the substrate stage 71 are cables for supplying electric power to driving means such as motor disposed within the substrate stage, a coolant pipe for cooling the motor, a coolant pipe for keeping the substrate stage at a predetermined temperature, a vacuum pipe for evacuating the vacuum hole formed in the substrate-mounting surface, and the like (these cables and pipes being collectively referred to as cables hereinafter). These cables 73 are secured to a securing section 73a of the substrate stage 71 and a securing section 73b within the apparatus. As the cables 73 deform between the securing sections 73a and 73b, the substrate stage 71 is allowed to freely move above the base 72.

FIGS. 10 to 12 schematically illustrate various states of the cables 73 when the substrate stage 71 is moved over the base 72. Namely, FIGS. 10 to 12 show states where the substrate stage 71 is positioned at the center, upper left portion, and lower right portion of the base 72, respectively.

When the substrate stage 71 moves from the position shown in FIG. 10 to that shown in FIGS. 11 or 12, while one cable securing section 73a securing the cables 73 moves together with the substrate stage 71, the other cable securing section 73b is kept stationary. Accordingly, as the substrate stage 71 moves, the cables 73 expands and contracts between the two cable securing sections 73a and 73b. Here, as the cables 73 tend to resume their original state, a reaction force 74 indicated by depicted arrow acts on the substrate stage 71 via the cable securing section 73a. Since the direction and magnitude of the reaction force 74 vary depending on the state of expansion and contraction of the cables 73, this reaction force, as disturbance, has adversely affected the positioning accuracy of the substrate stage 71.

SUMMARY OF THE INVENTION

In view of such a problem of the conventional substrate stage, it is an object of the present invention to provide an exposure apparatus in which the positioning accuracy of its substrate stage or the like is not influenced by cables.

In order to achieve this object, the present invention provides an exposure apparatus for projecting a mask pattern of a mask onto a substrate, the exposure apparatus comprising a substrate stage which is two-dimensionally movable along an upper surface of a substrate base while carrying the substrate thereon; cable-relaying means which is disposed so as to be physically separated from the surface of the substrate base, and is movable in the same two-dimensional directions as those of the substrate stage while securing thereto a cable connected to the substrate stage; and driving means to control an amount of movement of the cable-relaying means such that relative positions of the substrate stage and the cable-relaying means with respect to each other are always kept constant.

Consequently, the cable-relaying means moves so as to follow the substrate stage, whereby the relative positional relationship between the cable-relaying means and the substrate stage is always kept constant. As a result, the cable dragged between the substrate stage and the cable-relaying means always keeps a constant form, whereby the direction and magnitude of the reaction force applied to the substrate stage by the cable are always held constant as well. Accordingly, there is no fluctuation in reaction force, whereby the stage can secure accuracy in movement.

When a reticle stage is configured to be movable, it is preferred that the reticle stage has a configuration similar to that mentioned above.

In order to prevent the stage section from being influenced upon driving the cable-relaying means, the driving section is preferably placed in an auxiliary base section which is disposed so as to be physically separated from a base main body.

DETAILED DESCRIPTION OF THE PREFERRED EMBODIMENTS

In the following, embodiments of the present invention will be explained with reference to the accompanying drawings. Here, each drawing schematically shows, among constituents of the present invention, a stage unit and its peripherals. Sizes and forms shown in each drawing do not always coincide with those of actual apparatus. Also, in order to simplify explanation, constituents identical to each other are referred to with the same numerals as much as possible, without their overlapping descriptions being repeated.

Figure 1:
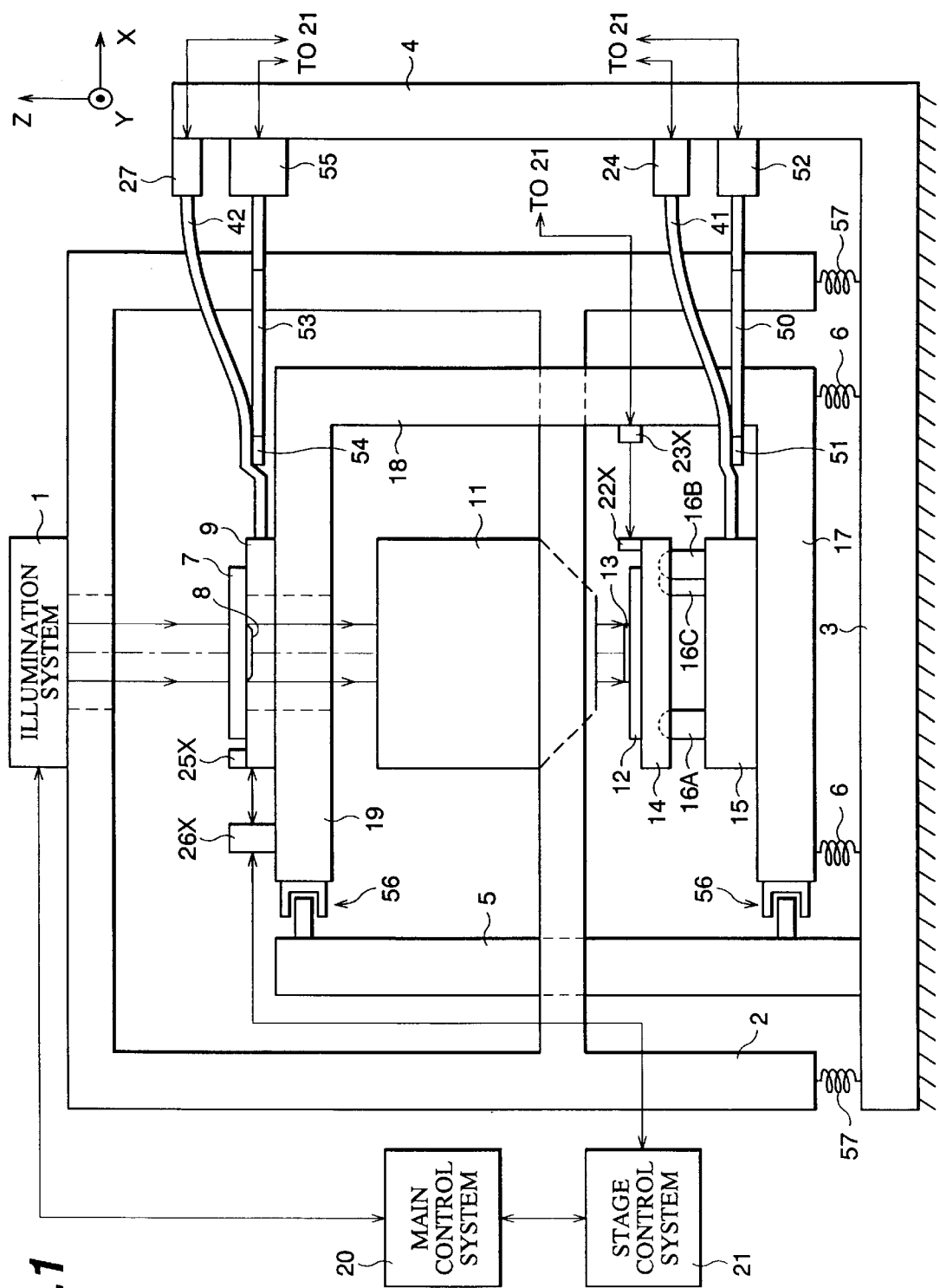
FIG. 1 is a schematic view showing a preferred embodiment of the exposure apparatus in accordance with the present invention.

FIG. 1 is a schematic view showing an embodiment of the exposure apparatus in accordance with the present invention. This exposure apparatus is an apparatus for projecting light from an illumination system 1 onto a mask 7 and projecting a mask pattern 8 of the mask 7 onto a photosensitive surface 13 of a photosensitive substrate 12 through a projective lens 11. The illumination system 1 and the projective lens 11 are supported by a frame 2, which is disposed on a hard mount 57 made of rubber, for example, which absorbs vibrations from a floor so as to prevent them from influencing the frame 2. The mask 7 having the mask pattern 8 is mounted on a reticle stage 9, which is movable over a reticle base 19 along its surface in two-dimensional directions (XY directions). The reticle stage 9 is moved in XY directions by a magnetic levitated type planar motor constructed between the reticle stage 9 and reticle base 19.

On the other hand, the photosensitive substrate 12 disposed so as to face the mask 7 is placed on a mounting table 14 which is positioned on a substrate stage 15 via actuators 16A to 16C. When the amount of movement of each of the actuators 16A to 16C in Z direction is adjusted, the position of the photosensitive substrate 12 in Z direction and the angle between the photosensitive substrate 12 and the substrate stage 15 can be regulated. The substrate stage 15 is movable in two-dimensional directions over a substrate base 17 along its surface. This movement is effected by a magnetic levitated type planar motor constructed between them. The substrate stage 15 and the reticle stage 9 are relatively moved in synchronization with each other. The substrate base 17 and the reticle base 19 are united together with a frame 18 and, via a vibration insulator 6 of any kind using an elastic material such as spring or air damper, is disposed on a floor section 3 mounted on the floor surface.

At the ends not connected to the frame 18, the substrate base 17 and the reticle base 19 are connected, via a vibration insulator 56 using a voice coil motor (VCM) or the like, to a frame 5 which is secured to the floor surface. Here, when a VCM is used, its stator side is positioned on the side of the frame 5, whereas its movable side is positioned on the side of the bases 17 and 19. This configuration can eliminate the vibration (reaction force) generated when the substrate stage 15 and the reticle stage 9 are moved in synchronization.

Drawn from the substrate stage 15 and reticle stage 9 are cables 41 and 42 which bundle power cables for supplying electricity to their respective planar motor sections, control lines, coolant pipes for transferring coolants for cooling the planar motors and individual stages, and the like. All the cables 41 and 42 are connected to the substrate stage 15 and reticle stage 9 via cable-relaying sections 51 and 54 which are two-dimensionally moved on XY-coordinate plane by robot arms 50 and 53, respectively.

Figure 2:
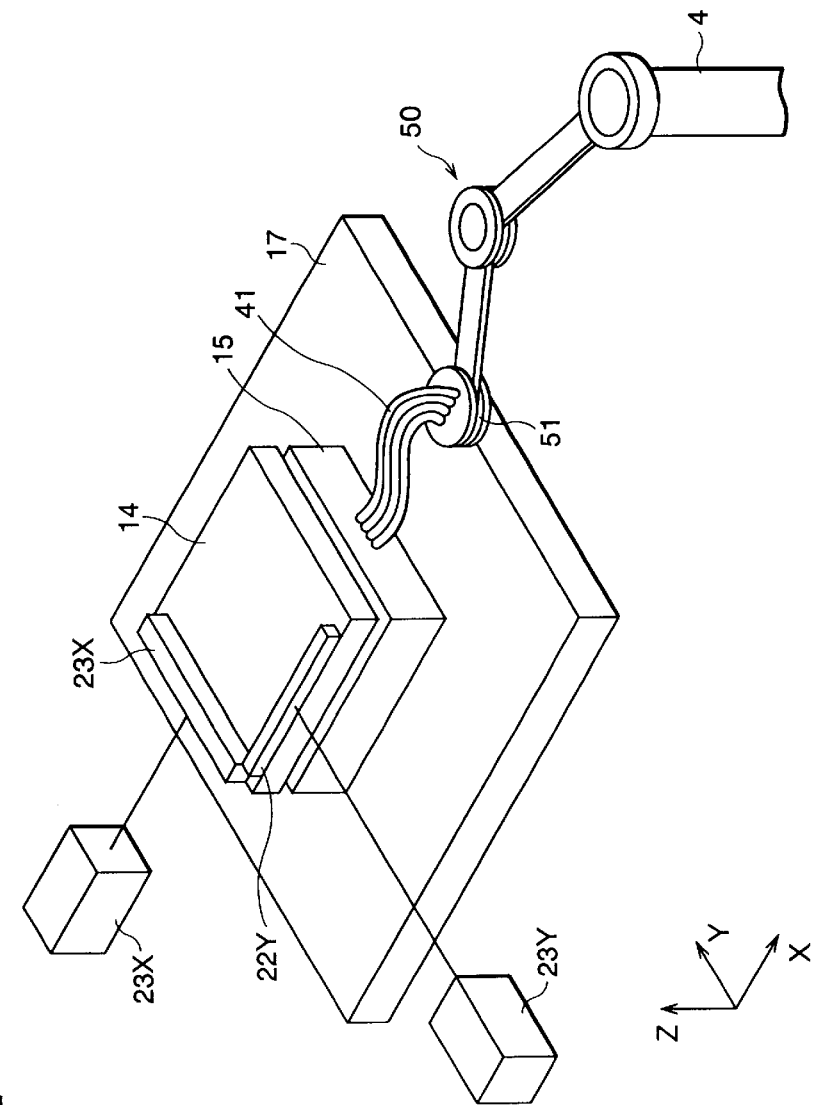
FIG. 2 is a perspective view showing a substrate stage unit of the apparatus shown in FIG. 1.

FIG. 2 is a perspective view showing the part corresponding to the substrate stage 15. The reticle stage 9 has a configuration basically similar thereto. As will be explained later, the robot arm 50 (53) moves the cable-relaying section 51 (54) so as to make it follow the substrate stage 15 (reticle stage 9) such that the cable-relaying section 51 (54) always keeps constant relative position and posture with respect to the substrate stage 15 (reticle stage 9) regardless of movement of the substrate stage 15 (reticle stage 9).

As shown in FIG. 1, respective robot main bodies 52 and 55 of the robot arms 50 and 53 are attached to a frame 4, which is secured to the floor surface independently of the floor section 3. Further attached to the frame 4 are a substrate stage driving system 24 and a reticle stage driving system 27 which are respectively connected with the cables 41 and 42.

On the other hand, the illumination system 1 for emitting an exposure light beam and a light beam for adjusting the position of photosensitive substrate 1 and a projection optical system for projecting the mask pattern 8 of the mask onto the shot area 13 of the photosensitive substrate 12 are fixed at their predetermined positions in the frame 2, which is also disposed on the floor section 3 via the vibration insulator 57.

By means of an X-axis movable mirror 22X secured to the upper end of the mounting table 14 and a laser interferometer 23X secured to the frame 18, the X-coordinate of the photosensitive substrate 12 is always monitored. Similarly, by means of a Y-axis movable mirror 22Y and an external laser interferometer 23Y (see FIG. 2), the Y-coordinate of the photosensitive substrate 12 is always monitored. Thus detected X- and Y-coordinates are transmitted to a stage control system 21. According to the transmitted coordinates, the stage control system 21 controls operations of the substrate stage 15 and mounting table 14 via the substrate stage driving system 24. Similarly, the X-coordinate of the mask 8 is always monitored by means of an X-axis movable mirror 25X secured to the upper end of the reticle stage 9 and a laser interferometer 26X secured onto the reticle base 19; the Y-coordinate of the mask 8 is always monitored by means of a Y-axis movable mirror 25Y and an external laser interferometer 26Y (not depicted); and thus detected X- and Y-coordinates are transmitted to the stage control system 21. According to the transmitted coordinates, the stage control system 21 controls operations of the reticle stage 9 via the reticle stage driving system 27. The stage control system 21 and illumination system 1 are controlled by a main control system 20.

Various known alignment systems can be used for adjusting spatial positions of the shot area 13 of the photosensitive substrate 12 and the mask pattern 8 of the mask 7. These alignment systems include LSA (Laser Step Alignment) system in which an alignment mark formed like a dot series is irradiated with laser light, and the light diffracted or scattered by the alignment mark is used to detect the position of alignment mark; LIA (Laser Interferometric Alignment) system in which a grating-like alignment mark is irradiated, for example, with laser beams whose frequencies are slightly different from each other respectively from two directions, the resulting two diffracted light components are caused to interfere with each other, and the position of alignment mark is measured from their phases; FIA (Field Image Alignment) system in which image data of an alignment mark captured under illumination of light having a broad wavelength bandwidth whose light source is a halogen lamp are subjected to an image processing for measurement; and the like. These systems are disclosed in U.S. Pat. Nos. 5,151,750 and 4,780,617.

On the other hand, these alignment systems can be roughly divided into TTL (though-the-lens) system in which the position of photosensitive substrate is measured through a projection optical system; TTR (through-the-reticle) system in which the positional relationship between the reticle and photosensitive substrate is measured through the projection optical system and reticle; and off-axis system in which the position of photosensitive substrate is directly measured without using the projection optical system.

The illumination light (alignment light) for illuminating the alignment mark may be either nonexposure light which has a wavelength different from the exposure light and to which the photosensitive layer on the photosensitive substrate is insensitive, or the exposure light itself.

Though FIG. 1 shows an example of TTR system, without being restricted thereto, various kinds of alignment systems such as TTL and off-axis systems may be employed. The alignment adjustment of these systems is controlled by the main control system 20.

In the following, the movable stage of the present invention will be explained with reference to the substrate stage 15 as an example. The reticle stage 9 operates on basically the same principle. Accordingly, though the reticle stage 9 will not be explained in detail, one skilled in the art will be able to fully comprehend the reticle stage 9 from the following explanation concerning the substrate stage 15.

Figure 3:
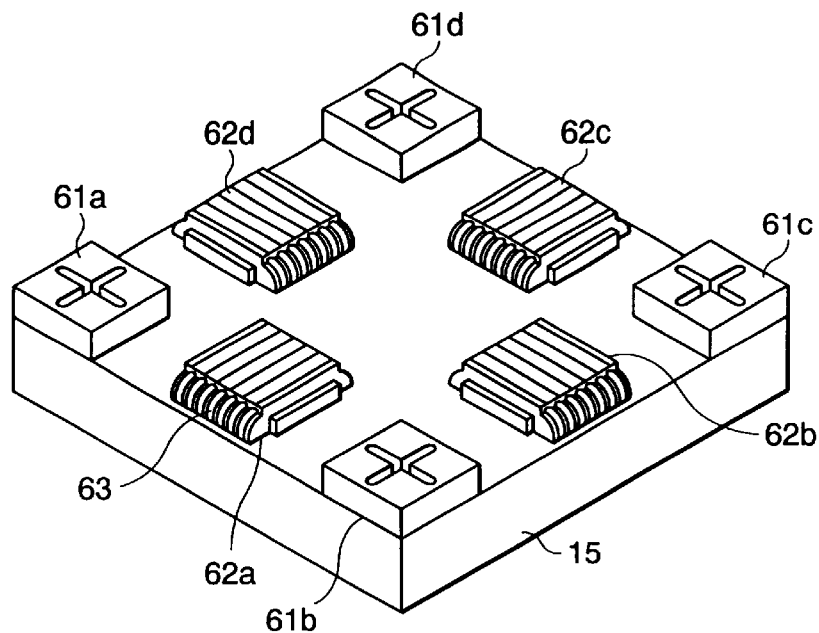
FIG. 3 is a view showing a configuration of the lower surface of the substrate stage shown in FIG. 2.

FIG. 3 is a view showing a configuration of the lower surface of the substrate stage 15. In the lower surface of the substrate stage 15, air spouts 61a to 61d for spouting air for levitation are disposed, for example, respectively at its four corners; whereas electromagnets 62a to 62d constituting movable parts of a levitation type planar motor are placed at intermediate areas between respective pairs of neighboring air spouts. Each of the electromagnets 62a to 62d comprises a polyphase winding 63. The winding direction of the electromagnet 62a is the same as that of the electromagnet 62c, the winding direction of the electromagnet 62b is the same as that of the electromagnet 62d, and the winding direction of the electromagnets 62a and 62c is orthogonal to that of the electromagnets 62b and 62d.

Figure 4:
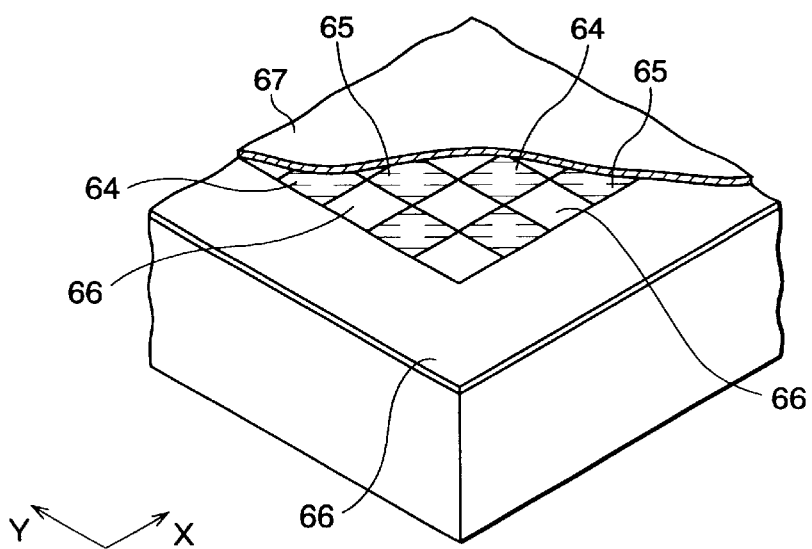
FIG. 4 is a schematic view showing a configuration of a base of the substrate stage unit shown in FIG. 2.

FIG. 4 is a schematic view showing the upper surface of the base. In the upper surface of the base 17, numerous permanent magnets constituting stators of the motor are arranged in a checker pattern such that square North poles 64 and square South poles 65 alternately align in both X and Y directions with square areas made of a nonmagnetic member 66 being interposed between the neighboring poles. The peripheral portion of the base 17 is covered with the nonmagnetic member 66. In order to make the surface of the base 17 flat, a nonmagnetic thin film 67 made of ceramic or glass with a polished surface is disposed on the magnets 64 and 65 and nonmagnetic member 66.

Figure 5:
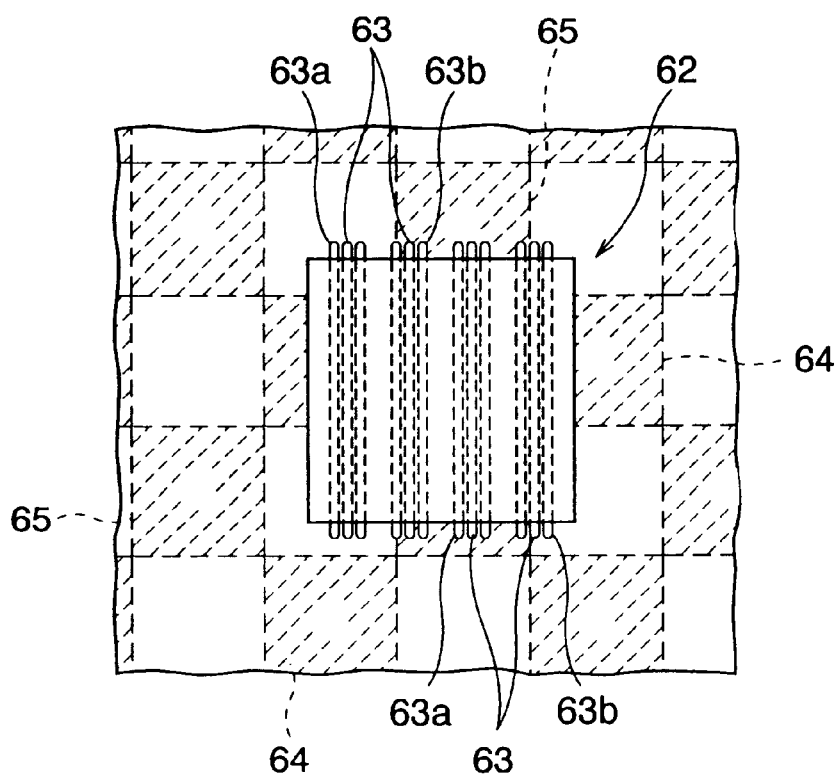
FIG. 5 is a view showing a relationship between stators and a movable part in a motor used in the substrate stage unit shown in FIG. 2.

FIG. 5 is a view showing a relationship between stators and a movable part of this motor. It illustrates a state where one piece 62 of the electromagnets 62a to 62d disposed on the lower surface of the substrate stage 15 is positioned above the arrangement of North and South poles on the upper surface of the base 17. The electromagnet 62 is wound with a two-phase winding composed of a first-phase winding 63a and a second-phase winding 63b. This drawing shows a state where electricity is supplied to the first-phase winding 63a, while the current fed to the second-phase winding 63b is cut off. When the direction of current is reversed depending on whether the windings 63a and 63b are moving above the North or South pole, the electromagnet 62 is moved over the base 17 in a predetermined direction. When currents flow in the same direction through the electromagnets 62a and 62c or through the electromagnets 62b and 62d, the substrate stage 15 is translated along X or Y direction. On the other hand, when currents having the same magnitude directed opposite to each other respectively flow through the electromagnets 62a and 62c or through the electromagnets 62b and 62d, the substrate stage 15 rotates within XY plane.

Though the configuration of a magnetic levitated type planar motor is explained with reference to FIGS. 3 to 5 in the foregoing, the stage driving means of the present invention should not be restricted thereto. For example, driving means disclosed in U.S. Pat. No. 4,535,278 may be used as well.

Figure 6:
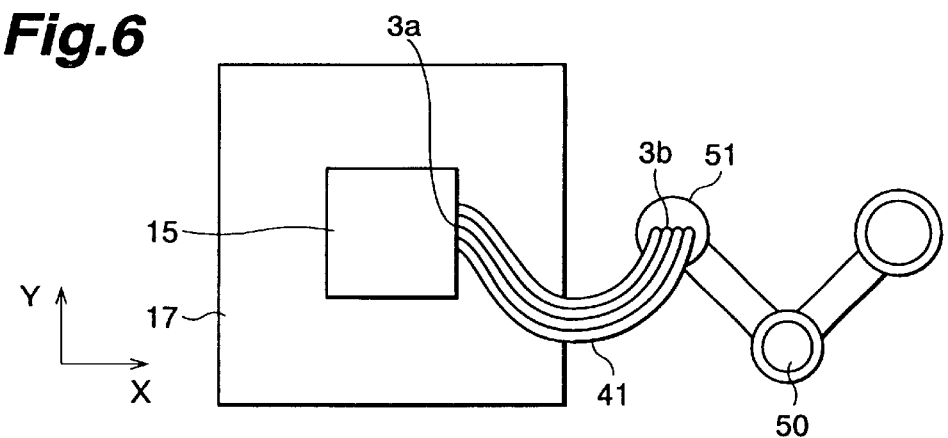
FIGS. 6 to 8 are schematic views respectively showing states of cables when the substrate stage is moved over the substrate base.
Figure 7:
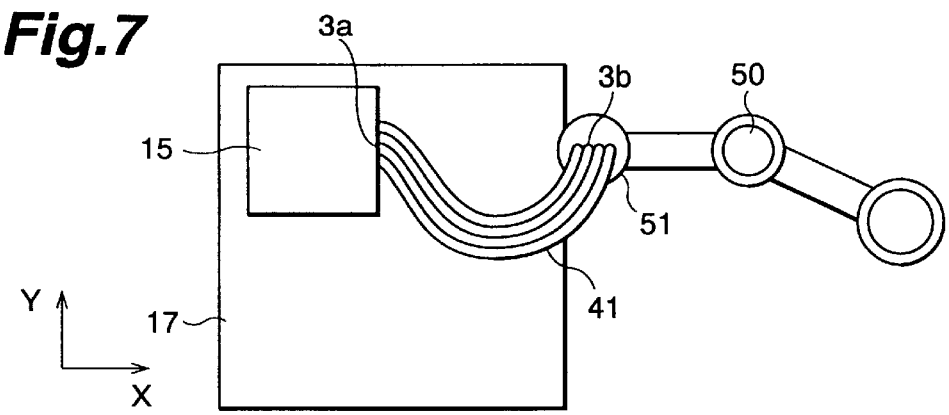
Figure 8:
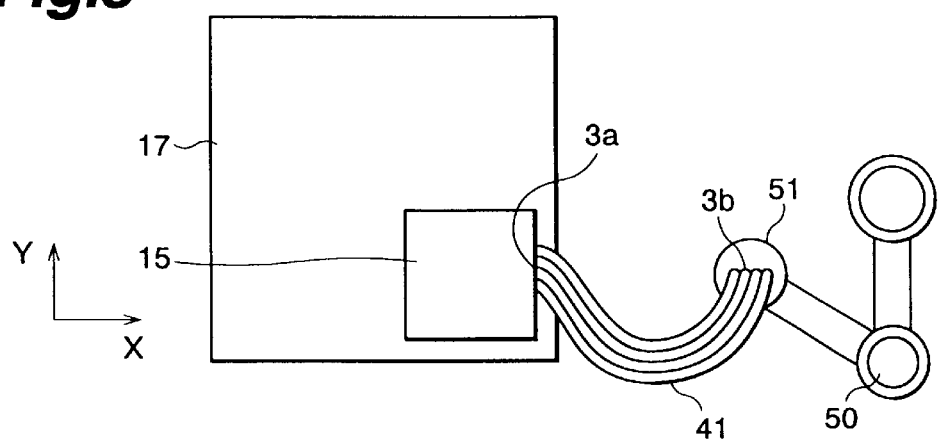
Figure 9:
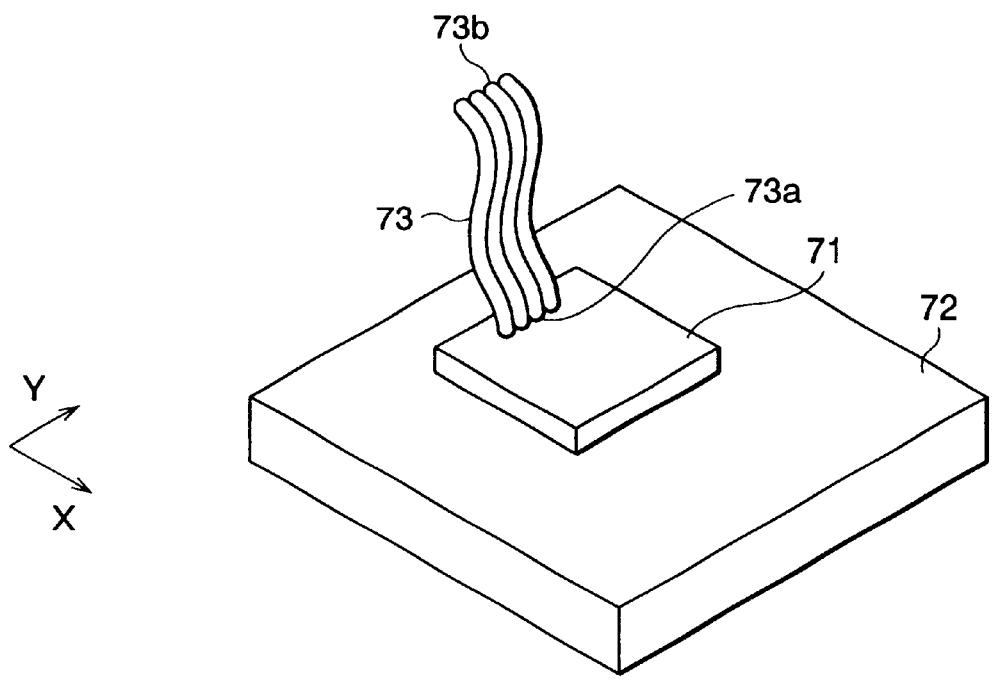
FIG. 9 is a conceptual view showing a substrate stage unit of a conventional exposure apparatus.
Figure 10:
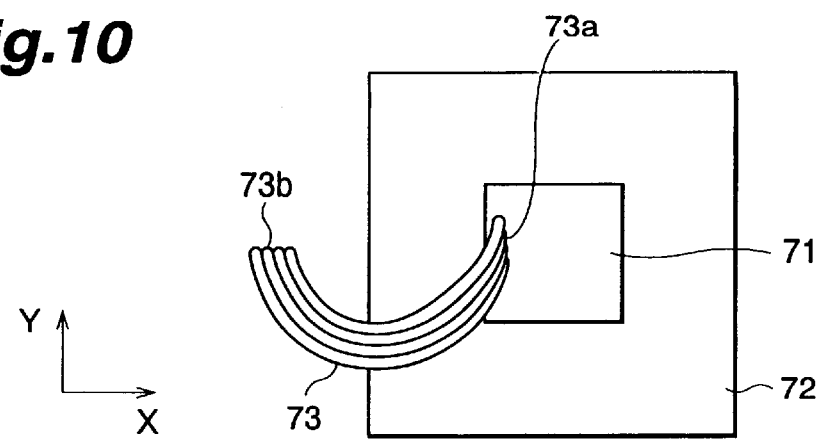
FIGS. 10 to 12 are schematic views respectively showing states of cables when the substrate stage is moved over the substrate base in the apparatus shown in FIG. 9.
Figure 11:
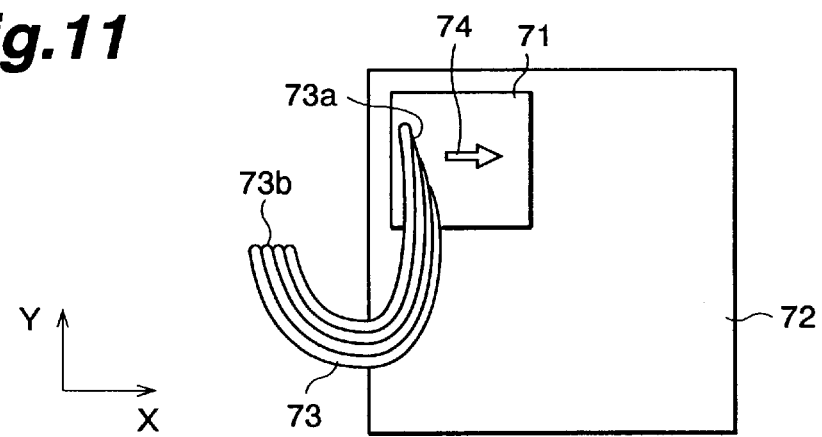
Figure 12:
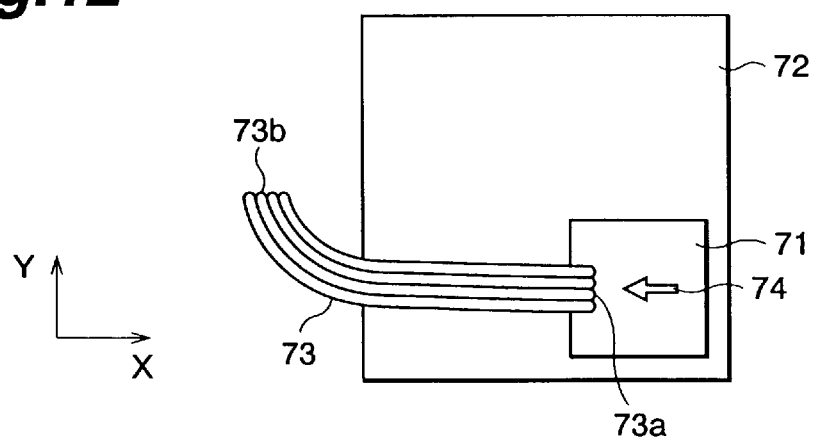

FIGS. 6 to 8 are schematic views showing states of the cables 41 when the substrate stage 15 is moved over the base 17. The cables 41 of the substrate stage 15 are secured to the substrate stage 15 by the securing section 3a and to the cable-relaying section 51 by the securing section 3b. The cable-relaying section 51 is two-dimensionally movable within XY plane by the robot arm 50.

The main control system 20 supplies a driving signal to the substrate stage driving system 24 via the stage control system 21 and, at the same time, a driving signal to the robot arm 50, thereby causing the movement of the cable-relaying section 51 to follow that of the substrate stage 15. Namely, when the substrate stage 15 is moved within XY plane by ($\Delta$x, $\Delta$y), the main control system 20 instructs the robot arm 50 to move the cable-relaying section 51, which is disposed at the tip thereof, by the same amount ($\Delta$x, $\Delta$y) as the amount of movement of the substrate stage 15. The information about the amount of movement ($\Delta$x, $\Delta$y) may be either directly acquired from the instruction from the main control system 20 concerning the substrate stage 15 or obtained from the laser interferometers 23X and 23Y for monitoring the position of the mounting table 14 disposed on the substrate stage 15.

Thus, the cable-relaying section 51 securing the cables 41 at the securing section 3b two-dimensionally moves within XY coordinate system so as to follow the movement of the substrate stage 15 such that its relative position with respect to the substrate stage 15 does not fluctuate. When moving the cable-relaying section 51, the robot arm 50 causes the cable-relaying section 51 to pivot about the arm so that the cable-relaying section 51 does not rotate within XY coordinate system, i.e., so that relative postures of the cable-relaying section 51 and substrate stage 15 with respect to each other do not fluctuate.

Consequently, as shown in FIGS. 6 to 8, the cables 41 extending from the substrate stage 15 can always maintain the same form whether the substrate stage 15 is located at the center portion of the base 17 (see FIG. 6), moves from the center portion of the base 17 to its upper right portion (see FIG. 7), or moves to the lower left portion (see FIG. 8). Accordingly, even if a reaction force from the cables 41 acts on the substrate stage 15, the reaction force will be always kept constant regardless of the position of substrate stage 15, thereby failing to deteriorate the positioning accuracy of the substrate stage 15.

In accordance with the present invention, the forms of cables extending from the substrate stage and reticle stage can be kept constant between the cable-relaying section and these stages, so that the reaction force acting on the substrate stage from the cables becomes constant, thus allowing the substrate stage to improve its positioning accuracy.

What is claimed is:

1. An exposure apparatus for projecting a mask pattern of a mask onto a photosensitive substrate, said exposure apparatus comprising:

a substrate stage which is two-dimensionally movable along an upper surface of a substrate base while carrying said photosensitive substrate thereon;

substrate stage cable-relaying means for securing thereto a cable connected to said substrate stage and being movable in the same two-dimensional directions as those of said substrate stage;

supporting means for supporting said substrate stage cable-relaying means;

vibration insulating means for insulating vibration that transfers from said supporting means to said substrate base; and first driving means for controlling an amount of movement of said substrate stage cable-relaying means such that relative positions of said substrate stage and said substrate stage cable-relaying means with respect to each other are always kept constant.

2. An exposure apparatus according to claim 1, wherein said substrate stage cable-relaying means is held, together with a driving section of said first driving means, by said supporting means physically separated from a base main body having said substrate base surface.

3. An exposure apparatus according to claim 2, wherein said base main body is disposed on a floor surface via an another vibration insulating means.

4. An exposure apparatus according to claim 1, further comprising:

a reticle stage which is movable in two-dimensional directions along an upper surface of a reticle base while carrying said mask thereon;

reticle stage cable-relaying means for securing thereto a cable connected to said reticle stage and being movable in the same two-dimensional directions as those of said reticle stage;

second supporting means for supporting said reticle stage cable-relaying means;

second vibration insulating means for insulating vibration that transfers from said second supporting means to said reticle base; and second driving means for controlling an amount of movement of said reticle stage cable-relaying means such that relative positions of said reticle stage and said reticle stage cable-relaying means with respect to each other are always kept constant.

5. An exposure apparatus according to claim 4, wherein each of said stage cable-relaying means is held, together with a driving section of said first driving means corresponding thereto, by said corresponding supporting means physically separated from a base main body having said substrate base surface and reticle base surface.

6. An exposure apparatus according to claim 5, wherein said base main body is disposed on a floor surface via another vibration insulating means.

7. An exposure apparatus according to claim 4, wherein said second supporting means is integrated with said supporting means.

8. An exposure apparatus for projecting a mask pattern of a mask onto a photosensitive substrate, said exposure apparatus comprising:

a substrate stage which is movable along an upper surface of a substrate base while carrying said photosensitive substrate thereon in a state where said substrate stage is physically not in contact with said substrate base;

substrate stage cable-relaying means for securing thereto a cable connected to said substrate stage and being movable so as to follow movement of said substrate stage;

supporting means for supporting said substrate stage cable-relaying means; and vibration insulating means for insulating vibration that transfers from said supporting means to said substrate base.

9. An exposure apparatus for projecting a mask pattern of a mask onto a photosensitive substrate to, said exposure apparatus comprising:

a stage which is movable over a predetermined base at least in a one-dimensional direction while carrying said mask or said photosensitive substrate;

stage cable-relaying means for securing thereto a cable connected to said stage and being movable so as to follow movement of said stage;

supporting means for supporting said substrate stage cable-relaying means; and vibration insulating means for insulating vibration that transfers from said supporting means to said predetermined base.

10. An exposure apparatus which projects a pattern of a reticle onto a substrate, said exposure apparatus comprising:

a substrate stage which is two-dimensionally movable along an upper surface of a substrate thereon;

a substrate stage cable-relaying member that secures thereto a cable connected to said substrate stage and moves in the same two-dimensional directions as those of said substrate stage;

a support member that supports said substrate stage cable-relaying member;

a vibration insulator disposed between said substrate base and said support member, said vibration insulator insulates vibration that transfers from said support member to said substrate base; and a first driver, connected to said substrate stage cable-relaying member, which controls an amount of movement of said substrate stage cable-relaying member such that relative positions of said substrate and said substrate stage cable-relaying member with respect to each other are always kept constant.

11. An exposure apparatus according to claim 10, wherein said substrate stage cable-relaying member is held, together with a driving section of said first driver, by said support member physically separated from a base main body on which said substrate base is mounted.

12. An exposure apparatus according to claim 11, wherein said base main body is disposed on a floor surface via an another vibration insulator.

13. An exposure apparatus according to claim 10, further comprising:

a reticle stage which is movable in two-dimensional directions along an upper surface of a reticle base while carrying said reticle thereon;

a reticle stage cable-relaying member that secures thereto a cable connected to said reticle stage and moves in the same two-dimensional directions as those of said reticle stage;

a second support member that supports said reticle stage cable-relaying member;

a second vibration insulator disposed between said reticle base and said second support member, said second vibration insulator insulates vibration that transfers from said second supporting member to said reticle base; and a second driver, connected to said reticle stage cable-relaying member, which controls an amount of movement of said reticle stage cable-relaying member such that relative positions of said reticle stage and said reticle stage cable-relaying member with respect to each other are always kept constant.

14. An exposure apparatus according to claim 13, wherein each of said stage cable-relaying member is held, together with a driving section of said driver corresponding thereto, by said corresponding support member physically separated from a base main body having said substrate base surface and reticle base surface.

15. An exposure apparatus according to claim 14, wherein said base main body is disposed on a floor surface via another vibration insulator.

16. An exposure apparatus according to claim 13, wherein said second support member is integrated with said support member.

17. An exposure apparatus which forms a pattern onto a substrate, said exposure apparatus comprising:
   a substrate stage which is movable along an upper surface of a substrate base while carrying said substrate thereon in a state where said substrate stage is physically not in contact with said substrate base;
   a substrate stage cable-relaying member that secures thereto a cable connected to said substrate stage and moves so as to follow movement of said substrate stage;
   a support member that supports said substrate stage cable-relaying member; and
   a vibration insulator disposed between said substrate base and said support member, said vibration insulator insulates vibration that transfers from said support member to said substrate base.

18. An exposure apparatus which projects a pattern of a reticle onto a substrate, said exposure apparatus comprising:
   a stage which is movable over a predetermined base at least in a one-dimensional direction while carrying said reticle or said substrate;
   a stage cable-relaying member that secures thereto a cable connected to said stage and moves so as to follow movement of said stage;
   a support member that supports said stage cable-relaying member; and
   a vibration insulator disposed between said predetermined base and said support member, said vibration insulator insulates vibration that transfers from said support member to said predetermined base.

19. An exposure apparatus which forms a pattern onto a substrate, said exposure apparatus comprising:
   a stage which is movable over a predetermined base at least in a one-dimensional direction while carrying said reticle or said substrate;
   a stage cable-relaying member that secures thereto a cable connected to said stage and moves, so as to follow movement of said stage;
   a support member that supports said stage cable-relaying member; and
   a vibration insulator disposed between said predetermined base and said support member, said vibration insulator insulates vibration that transfers from said support member to said predetermined base.

20. A stage system which moves an object, said stage system comprising:
   a stage which is movable over a first base at least in a one-dimensional direction while carrying said object;
   a movable member supported by a second base which is disposed separated from said first base, said movable member securing thereto a cable connected to said stage;
   a first drive system, connected to said stage, which controls said stage according to a control signal;
   a second drive system, connected to said movable member, which controls said movable member so as to follow movement of said stage; and
   a vibration insulator disposed between said first base and said second base, said vibration insulator insulates vibration that transfers from said second base to said first base.

21. A stage system according to claim 20, wherein said first base is dynamically isolated from said second base.

22. A method for driving a stage system which moves an object at least in a one-dimensional direction, comprising the step of:
   driving a stage along an upper surface of a base, wherein said stage supports said object;
   driving a movable member so as to follow movement of said stage, said movable member supported by a support member; and
   insulating vibration that transfers from said support member to said base by a vibration insulator disposed between said base and said support member.

23. A method of operating an exposure apparatus to transfer a pattern of a mask onto a substrate, the apparatus having a projection optical system, a stage system arranged to be movable with respect to said projection optical system for mounting said substrate thereon; the method comprising the step of:
   driving said stage system by utilizing the method according to claim 22.

24. A method for making a wafer utilizing the operating method according to claim 23.

25. An exposure apparatus for projecting a mask pattern of a mask onto a photosensitive substrate, said exposure apparatus comprising:
   a substrate stage which is two-dimensionally movable along an upper surface of a substrate base while carrying said photosensitive substrate thereon;
   substrate stage cable-relaying means supported by a support member that is disposed physically separated from said substrate base, said substrate stage cable-relaying means securing thereto a cable connected to said substrate stage and being movable in the same two-dimensional directions as those of said substrate stage;
   a reticle stage which is movable in two-dimensional directions along an upper surface of a reticle base in parallel to said substrate base while carrying said mask thereon;
   reticle stage cable-relaying means disposed so as to be physically separated from the surface of said reticle base, said reticle stage cable-relaying means securing thereto a cable connected to said reticle stage and being movable in the same two-dimensional directions as those of said reticle stage;
   first driving means to control an amount of movement of said substrate stage cable-relaying means such that relative positions of said substrate stage and said substrate stage cable-relaying means with respect to each other are always kept constant; and
   second driving means to control an amount of movement of said reticle stage cable-relaying means such that relative positions of said reticle stage and said reticle stage cable-relaying means with respect to each other are always kept constant.

26. An exposure apparatus according to claim 25, wherein each of said stage cable-relaying means is held, together with a driving section of said first driving means corresponding thereto, by said support member physically separated from a base main body having said substrate base surface and reticle base surface.

27. An exposure apparatus according to claim 26, wherein said base main body is disposed on a floor surface via vibration-proofing means.

28. An exposure apparatus which projects a pattern of a reticle onto a substrate, said exposure apparatus comprising:
- a substrate stage which is two-dimensionally movable along an upper surface of a substrate base while carrying said substrate thereon;
- a substrate stage cable-relaying member supported by a support member that is disposed physically separated from said substrate base, said substrate stage cable-relaying member securing thereto a cable connected to said substrate stage and being movable in the same two-dimensional directions as those of said substrate stage;
- a reticle stage which is movable in two-dimensional directions along an upper surface of a reticle base is parallel to said substrate base while carrying said reticle thereon;
- a reticle stage cable-relaying member disposed so as to be physically separated from the surface of said reticle base, said reticle stage cable-relaying member securing thereto a cable connected to said reticle stage and being movable in the same two-dimensional directions as those of said reticle stage;
- a first driver, connected to said substrate stage cable-relaying member, which control an amount of movement of said substrate stage cable-relaying member such that relative positions of said substrate stage and said substrate stage cable-relaying member with respect to each other are always kept constant; and
- a second driver, connected to said reticle stage cable-relaying member, which control an amount of movement of said reticle stage cable-relaying member such that relative positions of said reticle stage and said reticle stage cable-relaying member with respect to each other are always kept constant.

29. An exposure apparatus according to claim 28, wherein each of said stage cable-relaying member is held, together with a driving section of said driver corresponding thereto, by said support member physically separated from a base main body having said substrate base surface and reticle base surface.

30. An exposure apparatus according to claim 29, wherein said base main body is disposed on a floor surface via a vibration insulator.

\* \* \* \* \*